US012155172B2

United States Patent
Negishi

(10) Patent No.: US 12,155,172 B2
(45) Date of Patent: Nov. 26, 2024

(54) METHOD FOR MANUFACTURING OPTICAL SEMICONDUCTOR DEVICE

(71) Applicant: Mitsubishi Electric Corporation, Tokyo (JP)

(72) Inventor: Masato Negishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 520 days.

(21) Appl. No.: 17/625,152

(22) PCT Filed: Mar. 6, 2020

(86) PCT No.: PCT/JP2020/009687
§ 371 (c)(1),
(2) Date: Jan. 6, 2022

(87) PCT Pub. No.: WO2021/059557
PCT Pub. Date: Apr. 1, 2021

(65) Prior Publication Data
US 2022/0271495 A1    Aug. 25, 2022

(30) Foreign Application Priority Data
Sep. 27, 2019  (WO) .................. PCT/JP2019/038160

(51) Int. Cl.
*H01S 5/0237*  (2021.01)
*H01S 5/024*  (2006.01)
*H01S 5/042*  (2006.01)

(52) U.S. Cl.
CPC ........ *H01S 5/0237* (2021.01); *H01S 5/02469* (2013.01); *H01S 5/04252* (2019.08)

(58) Field of Classification Search
CPC .............................. H01S 5/02355; H01S 5/405
See application file for complete search history.

(56) References Cited

U.S. PATENT DOCUMENTS 7,642,543 B2 * 1/2010 Kobayashi .......... H01L 33/0093
257/97
2004/0201029 A1 * 10/2004 Yamane ................ H01S 5/0237
257/99

(Continued)

FOREIGN PATENT DOCUMENTS

CN         1750284 A      3/2006
JP    2002-359427 A    12/2002

(Continued)

OTHER PUBLICATIONS

An Office Action mailed by China National Intellectual Property Administration on Mar. 31, 2023, which corresponds to Chinese Patent Application No. 202080066063.0 and is related to U.S. Appl. No. 17/625,152 with English language translation.

(Continued)

*Primary Examiner* — Tuan N Nguyen
(74) *Attorney, Agent, or Firm* — Studebaker & Brackett PC

(57) ABSTRACT

Provided here are: a mounting member having a front surface on which a diffusion bonding layer is formed; an optical semiconductor element provided with a light emitting part therein, and having a rear surface on which a diffusion bonding layer is formed; and an electrode layer formed from the diffusion bonding layer and the diffusion bonding layer by diffusion bonding therebetween; wherein, in the optical semiconductor element, the light emitting part is provided near a side of the optical semiconductor element so as to be displaced toward the mounting member. This configuration not only makes unnecessary the use of a solder, an Ag paste and the like to thereby prevent the light emitting part in the optical semiconductor element from being contaminated by the solder, but also allows the light (Continued)

emitting part to be closer to the mounting member-side to thereby achieve improvement in heat-dissipation capability.

4 Claims, 6 Drawing Sheets

(56) References Cited

U.S. PATENT DOCUMENTS

| | | |
|---|---|---|
| 2005/0221549 A1 | 10/2005 | Horie |
| 2006/0057817 A1 | 3/2006 | Sonoda et al. |
| 2008/0198889 A1 | 8/2008 | Horie |
| 2008/0268616 A1 | 10/2008 | Sonoda et al. |

FOREIGN PATENT DOCUMENTS

| | | |
|---|---|---|
| JP | 2005-123530 A | 5/2005 |
| JP | 2005-322881 A | 11/2005 |
| JP | 2011-243963 A | 12/2011 |
| JP | 2013-058593 A | 3/2013 |
| JP | 2014-207290 A | 10/2014 |
| JP | 2015-035532 A | 2/2015 |

OTHER PUBLICATIONS

International Search Report issued in PCT/JP2020/009687; mailed Jun. 2, 2020.

* cited by examiner

METHOD FOR MANUFACTURING OPTICAL SEMICONDUCTOR DEVICE

TECHNICAL FIELD

The present application relates to an optical semiconductor device and a method for manufacturing the same.

BACKGROUND ART

In accordance with elevated output power of semiconductor laser elements, bottom emission type semiconductor laser elements which are superior in heat-dissipation capability have come into use in optical semiconductor devices. As described in Patent Document 1, in the bottom emission type semiconductor laser element, a laser-light oscillation part (light emitting part) is formed nearer to the bottom of the semiconductor laser element (nearer to its portion to be bonded with a solder). In this manner, the light emitting part which generates heat is located at a position nearer to the mount, so that a semiconductor device with superior heat-dissipation capability can be achieved.

CITATION LIST

Patent Document

Patent Document 1: Japanese Patent Application Laid-open No. 2002-359427 (Paragraph 0006; FIG. 13)

SUMMARY OF THE INVENTION

Problems to be Solved by the Invention

However, according to such a bottom emission type semiconductor laser element, when the solder has crept up on an end face thereof, a failure due to the solder, such as short circuiting or the like, may occur in the light emitting part. Accordingly, there is a problem that a trouble may occur that is represented by a case where the semiconductor laser element cannot cause laser light oscillation.

This application discloses a technique for solving the problem as described above, and an object thereof is to provide an optical semiconductor device which causes the semiconductor laser element to surely perform laser light oscillation and which can be achieved at low cost, and a method for manufacturing the same.

Means for Solving the Problems

An optical semiconductor laser device disclosed in this application is characterized by comprising: a mounting member having a front surface on which a first bonding member or bonding layer is formed; an optical semiconductor element provided with a light emitting part or light receiving part therein, and having a rear surface on which a second bonding member or bonding layer is formed; and an electrode layer formed from the first bonding member or bonding layer and the second bonding member or bonding layer by diffusion bonding therebetween; wherein, in the optical semiconductor element, the light emitting part or light receiving part is provided near a side of the optical semiconductor element so as to be displaced toward the mounting member.

A method for manufacturing an optical semiconductor device disclosed in this application is characterized by comprising: a step of stacking in parallel, multiple sets of mounting members and optical semiconductor elements laid thereon and then clamping these multiple sets by using a jig, said mounting members each having a front surface on which a first bonding member or bonding layer is formed, and said optical semiconductor elements each being provided with a light emitting part or light receiving part therein and each having a rear surface on which a second bonding member or bonding layer is formed; and a step of heating under vacuum, the multiple sets of the mounting members and the optical semiconductor elements clamped using the jig, thereby to bond together the mounting member and the optical semiconductor element in each of the multiple sets, by diffusion bonding between the first bonding member or bonding layer and the second bonding member or bonding layer, and to form an insulating film on each of the optical semiconductor elements at its surfaces inside of which the light emitting part or light receiving part is provided.

Effect of the Invention

According to this application, it is possible not only to make unnecessary the use of a solder, an Ag paste and the like to thereby prevent the light emitting part or light receiving part in the optical semiconductor element from being contaminated by the solder, but also to make the light emitting part or light receiving part closer to the mounting member-side to thereby achieve improvement in heat-dissipation capability.

MODES FOR CARRYING OUT THE INVENTION

Embodiment 1

Figure 1:
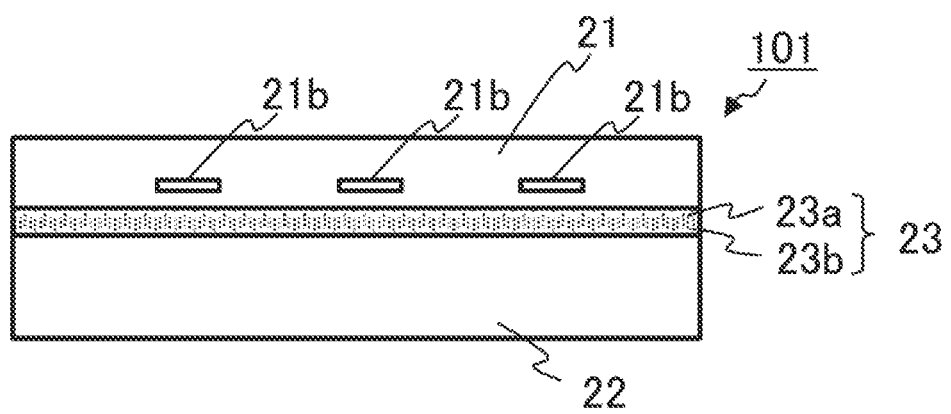
FIG. 1 is a front view showing a configuration of an optical semiconductor device according to Embodiment 1.
Figure 2:
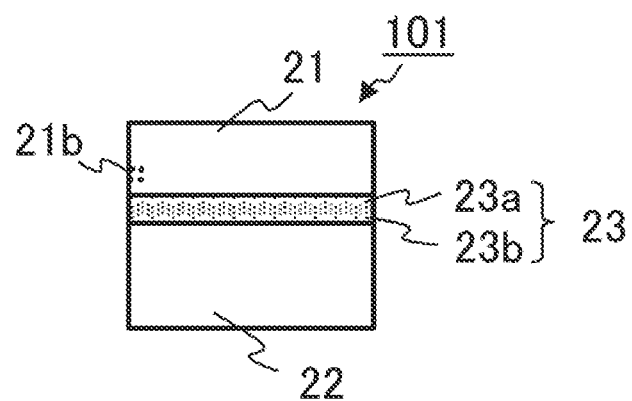
FIG. 2 is a side view showing a configuration of the optical semiconductor device according to Embodiment 1.

FIG. 1 is a front view showing a configuration of an optical semiconductor device 101 according to Embodiment 1 of this application. FIG. 2 is a side view showing a configuration of the optical semiconductor device 101 according to Embodiment 1 of this application. As shown in FIG. 1 and FIG. 2, in the optical semiconductor device 101, an optical semiconductor element 21 is mounted on a front-surface side of a mounting member 22.

The optical semiconductor element 21 is bonded to the front-surface side of the mounting member 22. In order to increase the heat discharge efficiency of the optical semiconductor element 21, a light emitting part 21b thereof, which is highest in temperature in the optical semiconductor element 21, is provided to be displaced, in the thickness direction of the optical semiconductor element 21, toward the mounting member to which the optical semiconductor element is bonded. Note that, although the light emitting part is described herein, it may instead be a light receiving part.

The mounting member 22, to the front-surface side of which the optical semiconductor element 21 is bonded, dissipates heat generated in the optical semi-conductor element 21. In order to efficiently discharge heat generated particularly from the light emitting part 21b in the optical semiconductor element 21, the mounting member 22 is bonded to be placed nearby the light emitting part 21b. As a material constituting the mounting member 22, a ceramic, a semiconductor or a metal may be used.

Heretofore, in order to make bonding between an optical semiconductor element and a mounting member, a solder, an Ag paste or the like, is used. However, when no distance is taken between the surface of which the light emitting part is provided and the edge of the mounting member, the solder, the Ag paste or the like may be adhered, due to its spreading out, to the light emitting part, resulting in deterioration of its characteristics.

Further, according to a conventional optical semiconductor device, a film material applied around the light emitting part or light receiving part, is an insulating film. This may increase the thermal resistance value and the electric resistance value between the optical semiconductor element and a mounting member on which the optical semiconductor element is mounted. The increased thermal resistance value makes higher the temperature of the optical semiconductor element itself due to generation of heat in the optical semiconductor element at the time of light emission or light reception.

This decreases, for example, output power of the emitted light or output power of the received light, namely, deteriorates the characteristics. In particular, in a recent trend of chip miniaturization and output power elevation, an influence of such deterioration becomes significant greatly. Further, the increased electric resistance value makes the power consumption larger and thus cannot contribute to recent reduction in power consumption. Furthermore, when fluctuation occurs in the thermal resistance value and/or the electric resistance value, the characteristics will also be fluctuated, resulting in degraded quality.

In this respect, the optical semiconductor device 101 according to Embodiment 1 of this application is characterized in that the optical semiconductor element 21 and the mounting member 22 are bonded to each other, through an electrode layer 23 that is made of a metal and that is formed from a diffusion bonding layer (or diffusion bonding member) 23a as a first bonding layer (or bonding member) formed on a rear surface of the optical semi-conductor element 21, and a diffusion bonding layer (or diffusion bonding member) 23b as a second bonding layer (or bonding member) formed on a front surface of the mounting member 22, by diffusion bonding therebetween.

The material of the electrode layer 23 is exemplified by Au.

According to the configuration disclosed in this application, in order to make bonding between the optical semiconductor element 21 and the mounting member 22, diffusion bonding is employed that uses the diffusion bonding layers 23a, 23b for the electrode layer 23. Thus, it is possible not only to make unnecessary the use of a solder, an Ag paste and the like to thereby prevent the light emitting part in the optical semiconductor element from being contaminated by the solder, but also to make the light emitting part closer to the mounting member-side to thereby achieve improvement in heat-dissipation capability.

Next, description will be made about a manufacturing method of the optical semiconductor device 101 according to Embodiment 1, on the basis of FIG. 3A to FIG. 3E and FIG. 4. FIG. 3A to FIG. 3E are diagrams showing manufacturing steps of the optical semiconductor device 101 according to Embodiment 1. FIG. 4 is a flowchart showing a sequence of steps in the manufacturing method of the optical semiconductor device 101 according to Embodiment 1.

Figure 3A:
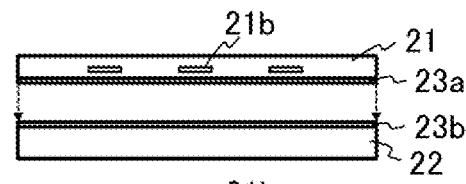
FIG. 3A to 3E are diagrams showing manufacturing steps of the optical semiconductor device according to Embodiment 1.
Figure 3B:
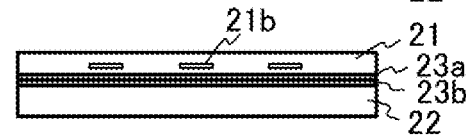
Figure 4:
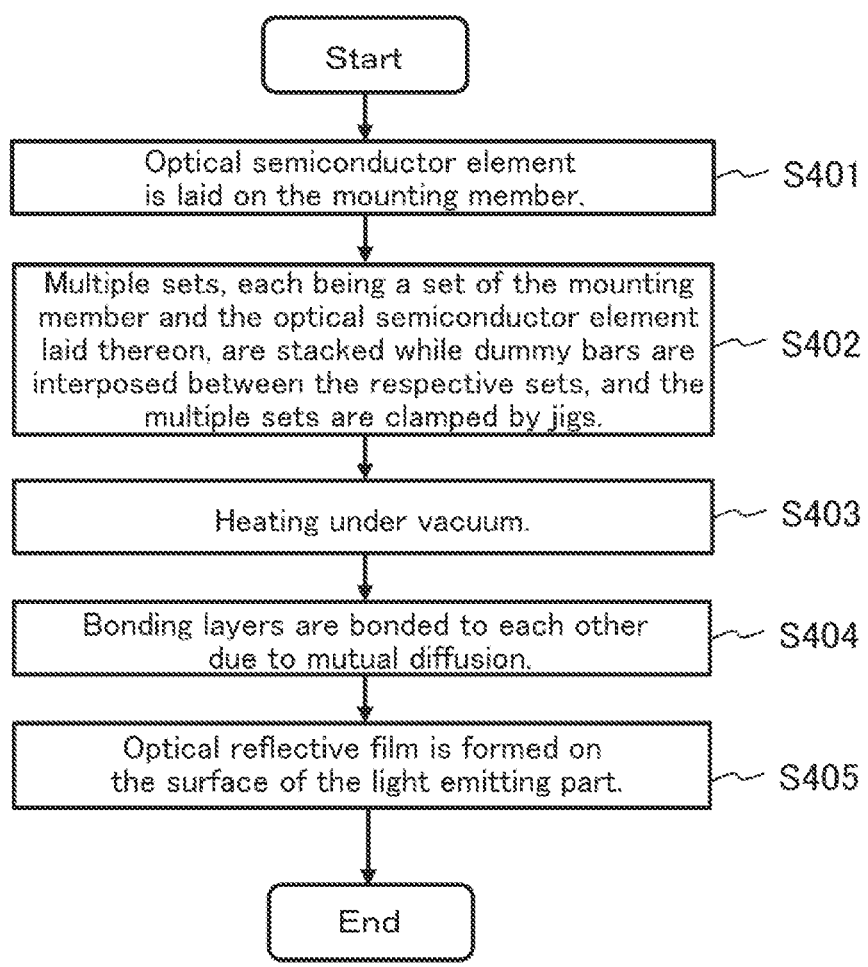
FIG. 4 is a flowchart showing a sequence of steps in a manufacturing method of the optical semiconductor device according to Embodiment 1.

First of all, as shown in FIG. 3A, the optical semiconductor element 21 having a rear surface on which an Au layer as the diffusion bonding layer 23a is formed by a sputtering method, a vapor deposition method or the like, and the mounting member 22 having a front surface on which an Au layer as the diffusion bonding layer 23b is formed by a sputtering method, a vapor deposition method or the like, are prepared. Then, as shown in FIG. 3B, the optical semiconductor element 21 is laid on the mounting member 22 so that the Au layer as the diffusion bonding layer 23a and the Au layer as the diffusion bonding layer 23b are overlapped with each other (Step S401). Note that, on a front surface of the optical semiconductor element 21, an unshown front-surface electrode is formed, and on a rear surface of the mounting member 22, an unshown rear-surface electrode is formed.

Figure 3C:
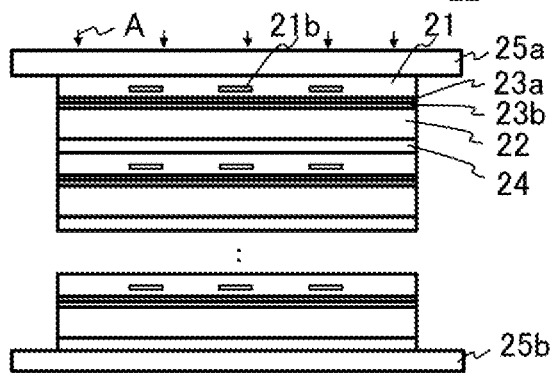

Subsequently, as shown in FIG. 3C, multiple sets, each being a set of the mounting member 22 and the optical semiconductor element 21 laid thereon, are stacked in parallel while dummy bars 24 for preventing reaction (diffusion bonding) between the front-surface electrode of the optical semiconductor element 21 and the rear-surface electrode of the mounting member 22, are interposed between the respective sets, and then the multiple sets are clamped by a jig 25a and a jig 25b so as to be under pressure as a whole from the direction A (Step S402). As the dummy bar 24, a dummy bar made of Si is used, for example.

Figure 3D:
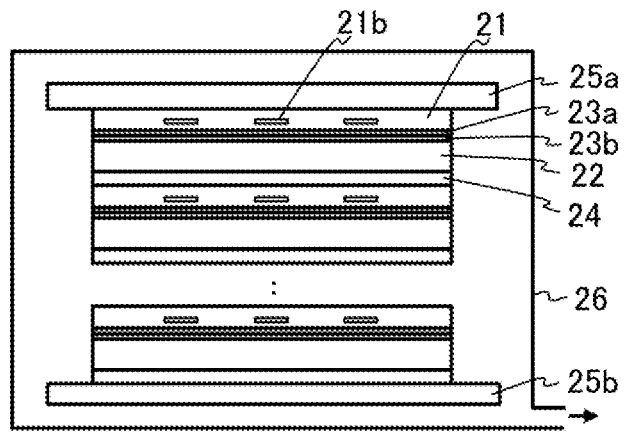

Then, as shown in FIG. 3D, the multiple sets of the mounting members 22 and the optical semiconductor elements 21 laid thereon, that are clamped by the jigs 25a, 25b, are placed in a chamber 26 and heated under vacuum (Step S403). The heating temperature is set to about 200° C.

When they are heated under vacuum up to the temperature specified above, the Au layer as the diffusion bonding layer 23a and the Au layer as the diffusion bonding layer 23b are bonded to each other due to mutual diffusion of their respective Au atoms (Step S404). Such a bonding step of bonding the optical semiconductor element 21 and the mounting member 22 together, is an important step that provides a function of discharging heat generated at the time of light emission or light reception of the optical semiconductor element, and thus has a large effect on a characteristic of the optical semiconductor element such as a photo-electric conversion efficiency or the like, or on the reliability thereof.

In addition, after reaching the specified temperature, an insulating film (not shown) is formed entirely on each of the optical semiconductor elements 21 at its surfaces inside of which the light emitting part 21b is provided, as well as on each of the mounting members 22, by a sputtering method, a vapor deposition method or the like (Step S405). Such a step of forming the insulating film is taken for controlling an optical reflectivity with respect to the light emitting part in the optical semiconductor element, and is an important step that has a large effect on the characteristic of the optical semiconductor element such as a threshold value or the like, or on the reliability thereof.

Figure 3E:
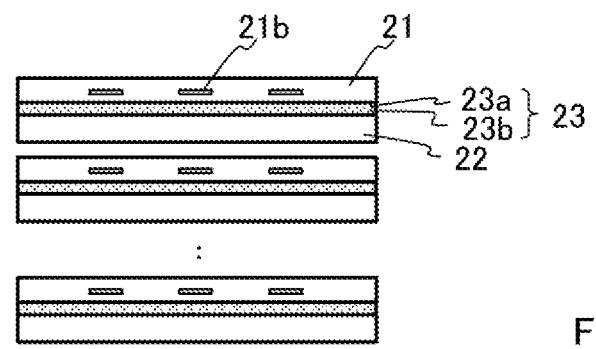

According to the foregoing steps, as shown in FIG. 3E, it is possible to obtain the optical semiconductor devices 101 in each of which the optical semiconductor element 21 and the mounting member 22 are diffusion-bonded to each other using the diffusion bonding layer 23a and the diffusion bonding layer 23b for the electrode layer 23.

According to a conventional manufacturing method, only the multiple optical semiconductor elements are stacked in parallel while dummy bars are interposed between the respective optical semiconductor elements, and they are clamped using a jig, and then an insulating film is merely formed on surfaces around each of the light emitting parts. After such film formation, each of the optical semiconductor elements is bonded to a mounting member by using a solder.

According to the manufacturing method of this application, since the bonding step and the film forming step are performed concurrently, it is possible to simplify the manufacturing steps, to thereby reduce the manufacturing time and cost.

As described above, the optical semiconductor device 101 according to Embodiment 1 comprises: the mounting member 22 having a front surface on which the diffusion bonding layer 23b is formed; the optical semiconductor element 21 provided with the light emitting part 21b therein, and having a rear surface on which the diffusion bonding layer 23a is formed; and the electrode layer 23 formed from the diffusion bonding layer 23b and the diffusion bonding layer 23a by diffusion bonding therebetween; wherein, in the optical semiconductor element 21, the light emitting part 21b is provided near a side of the optical semiconductor element 21 so as to be displaced toward the mounting member 22. Thus, in order to make bonding between the optical semiconductor element and the mounting member, diffusion bonding is employed that uses the diffusion bonding layers for the electrode layer, so that it is possible not only to make unnecessary the use of a solder, an Ag paste and the like to thereby prevent the light emitting part in the optical semiconductor element from being contaminated by the solder, but also to make the light emitting part closer to the mounting member-side to thereby achieve improvement in heat-dissipation capability.

Further, since the thermal resistance value between the optical semiconductor element and the mounting member is decreased, heat generated at the time of light emission or light reception of the optical semiconductor element will be discharged to more extent. Thus, it is possible to suppress reduction of output power of the received light or output power of the received light, to thereby achieve improvement in characteristics.

Further, since the electric resistance value between the optical semiconductor element and the mounting member is decreased, it is possible to reduce the power consumption.

Further, since fluctuation in the thermal resistance value and the electric resistance value between the optical semiconductor element and the mounting member is made small, it is possible to make fluctuation in characteristics small to thereby achieve improvement in quality.

Further, since it is unnecessary to use a solder, an Ag paste and the like as a bonding material between the optical semiconductor element and the mounting member, it is also possible to reduce the prime cost such as material cost, operation cost and the like.

Further, since it is unnecessary to use a solder, an Ag paste and the like as a bonding material between the optical semiconductor element and the mounting member, it is possible to suppress a failure from occurring due to the bonding material spreading out of the bonded region to block the light emitting part or the light receiving part, and thus to improve the production yield.

The method for manufacturing the optical semiconductor device 101 according to Embodiment 1 comprises: a step of stacking in parallel, multiple sets of the mounting members 22 and the optical semiconductor elements 21 laid thereon and then clamping these multiple sets by the jigs 25a, 25b, said mounting members each having a front surface on which the diffusion bonding layer 23b is formed, and said optical semiconductor elements each being provided with the light emitting part 21b therein and each having a rear surface on which the diffusion bonding layer 23a is formed; and a step of heating under vacuum, the multiple sets of the mounting members 22 and the optical semiconductor elements 21 clamped by the jigs 25a, 25b, thereby to bond together the mounting member 22 and the optical semiconductor element 21 in each of the multiple sets, by diffusion bonding between the diffusion bonding layer 23a and the diffusion bonding layer 23b, and to form an insulating film on each of the optical semiconductor elements 21 at its surfaces inside of which the light emitting part 21b is provided. Since the film forming step and the bonding step are performed concurrently, it is possible to simplify the manufacturing steps, to thereby reduce the manufacturing time and cost.

Meanwhile, in the manufacturing steps of an optical semiconductor device, a wafer is subjected to treatments as manufacturing processes in a manner to form individual layers, and a patterning treatment to form a rectangle shape or the like is performed depending on the layer. Thus, strains are distributed in a plane of the wafer on each layer basis, so that warpage due to strain may occur at the time the wafer is processed into thin plates. The optical semiconductor element results from cutting out the wafer. Thus, according to the structure of the optical semiconductor element, warpage is likely to occur at the film forming step around the light emitting part or the light receiving part, so that, in the clamped state, a minute gap may be created between the optical semiconductor element and the dummy bar or between the optical semiconductor elements. Further, when the force for clamping is increased in order to narrow the gap, a defect such as a cracking or the like may occur because the optical semiconductor element is mainly formed of brittle materials. Further, when the electrode of the optical semiconductor element located on its bonding surface to the mounting member to be used later for mounting, is made thick to thereby absorb the gap by virtue of the plasticity of the electrode, the prime cost of the optical semiconductor element increases because the material of the electrode is relatively expensive in term of cost structure. Thus, according to the conventional manufacturing method, the film material will intrude in the gap and thus be adhered to the bonding surface of the optical semiconductor element where it is mounted later on the mounting member. Furthermore, the adhered position and area, and the adhered density are depending on the spatial shape of the gap and thus, they are not uniformly provided and have fluctuations.

Figure 5A:
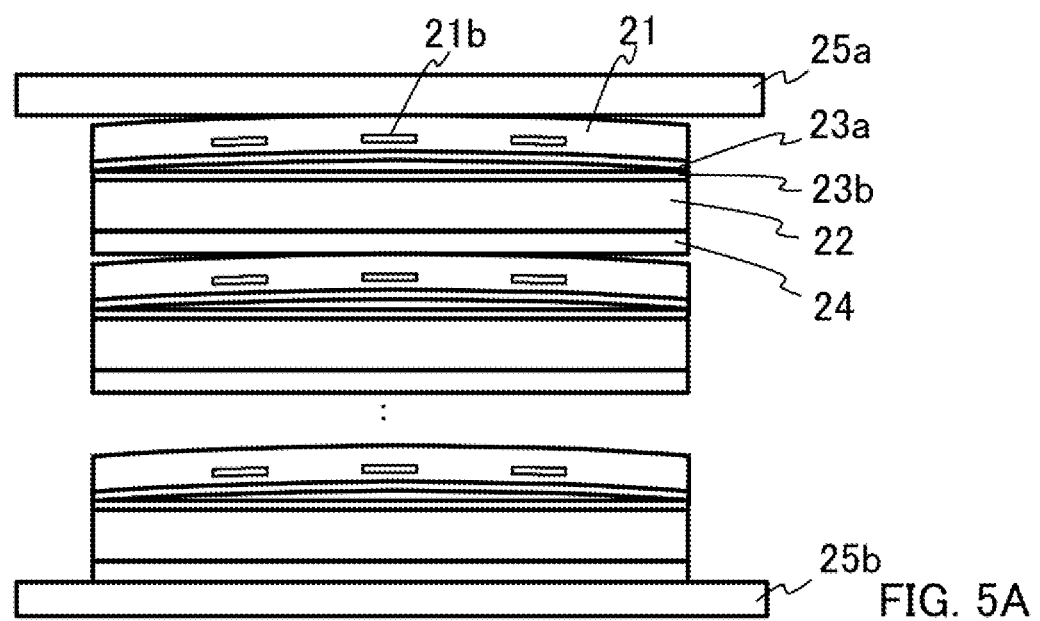
FIGS. 5A and 5B are diagrams for illustrating another configuration of the optical semiconductor device according to Embodiment 1.
Figure 5B:
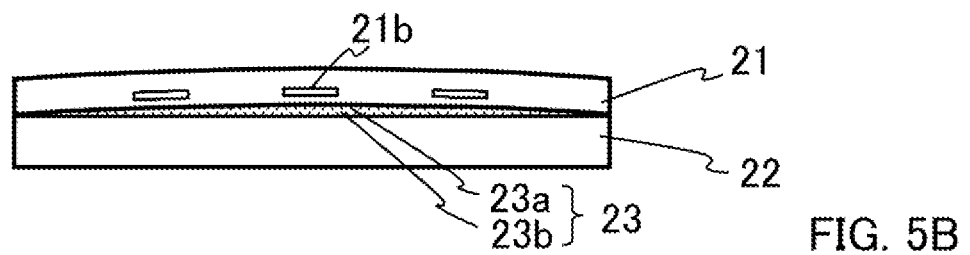

According to this application, these problems are also solved, because, in order to make bonding between the optical semiconductor element 21 and the mounting member 22, Au diffusion bonding is employed without using a solder, an Ag paste and the like, and accordingly, even if the optical semiconductor elements 21 are each in a warped state as shown in FIG. 5A, the bonding step and the subsequent film forming step can be performed successively in such a manner that the mounting members 22 and the optical semiconductor elements 21 laid thereon, that are clamped by the jigs 25a, 25b, are heated under vacuum. Thus, even with the optical semiconductor element that is still in a warped state as shown in FIG. 5B, an effect of Embodiment 1 described above can be obtained, and besides that, it is possible to obtain an optical semiconductor device which has no such gap and has no film material adhered to the bonding surface.

Further, although a ceramic-based mounting member is frequently used as the mounting member for mounting the optical semiconductor element, when it has been cut out by a cutting method such as dicing or the like at the time of processing the base member into the mounting members, micro cracking has occurred at an edge line of the shape thereof. Thus, minute cut-out chips will be produced by an impact or the like at the time of bonding the optical semiconductor element, and they may be adhered to the light emitting part or the light receiving part, resulting in deterioration of the characteristics.

According to the manufacturing method of this application, it is possible to prevent the production of minute cut-out chips and to suppress a failure due to adhesion thereof, to thereby improve the production yield.

Embodiment 2

In Embodiment 1, a case has been described where the dummy bars 24 are used in a manufacturing method of the optical semiconductor 101, whereas in Embodiment 2, a case will be described where no dummy bar is used therein.

Figure 6:
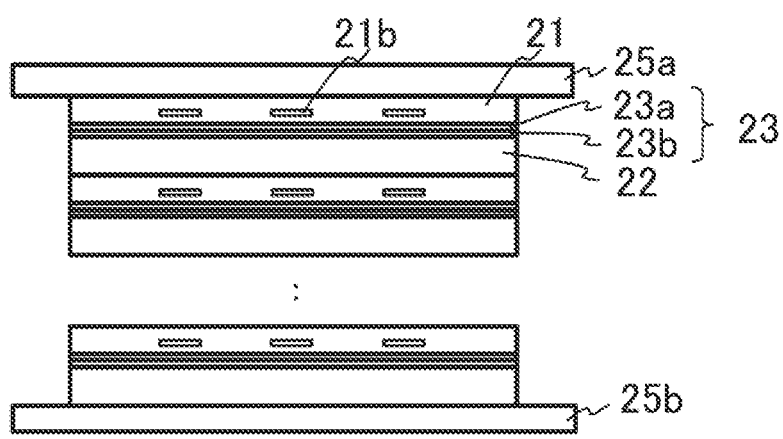
FIG. 6 is a diagram for illustrating a manufacturing method of an optical semiconductor device according to Embodiment 2.

FIG. 6 is a diagram for illustrating a manufacturing method of an optical semiconductor device 101 according to Embodiment 2. As shown in FIG. 6, multiple sets of the optical semiconductor elements 21 without having their respective front-surface electrodes to be formed thereon and the mounting members 22 without having their respective rear-surface electrodes to be formed thereon, are directly stacked in parallel and then clamped by the jigs 25a, 25b. Other than the above, the manufacturing method of the optical semiconductor device 101 according to Embodiment 2 is the same as that of the optical semiconductor device 101 according to Embodiment 1. Thus, for the equivalent parts, the same reference numerals are given, so that description thereof will be omitted.

In Embodiment 2, the front-surface electrode of each of the optical semiconductor elements 21 and the rear-surface electrode of each of the mounting members 22 are formed after the bonding step of the optical semiconductor element 21 and the mounting member 22 and the film forming step.

Heretofore, in the case where the film formation is applied to such multiple optical semi-conductor elements which are clamped by using a jig in a state in which their respective light emitting parts or light receiving parts are positioned uniformly, in order to prevent the optical semiconductor elements from being bonded to each other, at the time of clamping, a dummy bar made of Si or the like is interposed between each of the optical semiconductor elements and the other optical semiconductor element, or an anti-bonding film is provided on the front surface of each of the optical semiconductor elements. However, the use of the dummy bars generates dummy bar's material cost, operation cost for interposing the dummy bars, operation cost for removing the dummy bars, film material cost of films formed on the dummy bars, and the like. Further, in the case where the dummy bar is not used but a film that prevents the optical semiconductor elements in the clamped state from being bonded to each other, is formed on each of the optical semiconductor elements itself, the film material cost and the steps increase, so that the prime cost becomes higher.

In contrast, in Embodiment 2, the front surface of the optical semiconductor element 21 and the rear surface of the mounting member 22 do not cause diffusion bonding therebetween. Thus, it is unnecessary to use the dummy bars 24 used in Embodiment 1 for preventing reaction (diffusion bonding) between the front-surface electrode of the optical semiconductor element 21 and the rear-surface electrode of the mounting member 22, and also to use the formation of the film for preventing the optical semiconductor elements from being bonded to each other, so that it is possible to achieve reduction of the manufacturing cost.

As described above, in accordance with the manufacturing method of the optical semiconductor device 101 according to Embodiment 2, the front-surface electrode of each of the optical semiconductor elements 21 and the rear-surface electrode of each of the mounting members 22 are formed after the bonding step of the optical semiconductor element 21 and the mounting member 22 and the film forming step, so that the front-surface side of the optical semiconductor element 21 and the rear-surface side of the mounting member 22 do not cause diffusion bonding therebetween. Thus, it is unnecessary to use the dummy bars 24 used in Embodiment 1 for preventing reaction (diffusion bonding) between the front-surface electrode of the optical semiconductor element 21 and the rear-surface electrode of the mounting member 22, and also to use the formation of the film for preventing the optical semiconductor elements from being bonded to each other, so that it is possible to achieve reduction of the manufacturing cost and thus to enhance the productivity.

According to the conventional manufacturing method, a step of coating edge surfaces (around the light emitting or light receiving part) and a mounting step of the semiconductor chip are steps performed separately, so that (1) a portion of on-edge material (insulating film) that has come around into a bonded region during coating, makes the thermal/electrical conductivity lower, to thereby deteriorate the characteristics. In addition, (2) when, in order to close the gap due to the warpage with respect to the bar at the time of coating, the thickness of Au as a bonding member of the semiconductor chip is increased so that the gap may be closed by solely using that member, the prime cost in terms of the set of the semiconductor chip and the mount, becomes higher than that in the case where the gap is closed by using both that member and a bonding member of Au of the mounting member. In particular, in the case of (2), according to the conventional method, when the gap due to the warpage is to be closed during the edge coating in a manner without reforming the warpage as much as possible, since the dummy bar has no bonding member because the dummy bar is to be inserted for prevention of bonding, it is required for the bonding member of the optical semiconductor chip to have a thickness that is enough to close the gap portion due to the warpage.

According to this application, it suffices that the sum of the thickness of the bonding member of the optical semiconductor element and the thickness of the bonding member of the mounting member, corresponds to a thickness that is enough to close the gap portion due to the warpage.

In this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where at least one configuration element is added or omitted; and furthermore, where at least one configuration element is extracted and combined with a configuration element of another embodiment.

DESCRIPTION OF REFERENCE NUMERALS AND SIGNS

21: optical semiconductor element, 21b: light emitting part, 22: mounting member, 23: electrode layer, 23a: diffusion bonding layer, 23b: diffusion bonding layer, 25a, 25b: jig, 101: optical semiconductor device.

The invention claimed is:

1. A method for manufacturing an optical semiconductor device, comprising:
   a step of stacking in parallel, multiple sets of mounting members and optical semiconductor elements laid thereon and then clamping these multiple sets by using a jig, said mounting members each having a front surface on which a first bonding member or bonding layer is formed, and said optical semiconductor elements each being provided with a light emitting part therein and each having a rear surface on which a second bonding member or bonding layer is formed; and
   a step of heating under vacuum, the multiple sets of the mounting members and the optical semiconductor elements clamped using the jig, thereby to bond together the mounting member and the optical semiconductor element in each of the multiple sets by diffusion bonding between the first bonding member or bonding layer and the second bonding member or bonding layer, and to form an insulating film on all side surfaces of each of the optical semiconductor elements in which the light emitting part is provided;
   wherein each of the optical semiconductor elements is a semiconductor laser element; and
   wherein the insulating film formed on the side surfaces of each of the optical semiconductor elements serves to control an optical reflectivity with respect to the light emitting part in the semiconductor laser element.

2. The method for manufacturing an optical semiconductor device according to claim 1, wherein the first bonding member or bonding layer, and the second bonding member or bonding layer are made of Au.

3. A method for manufacturing an optical semiconductor device, comprising:
   a step of stacking in parallel, multiple sets of mounting members and optical semiconductor elements laid thereon and then clamping these multiple sets by using a jig, said mounting members each having a front surface on which a first bonding member or bonding layer is formed, and said optical semiconductor elements each being provided with a light emitting part therein and each having a rear surface on which a second bonding member or bonding layer is formed;
   a step of heating under vacuum, the multiple sets of the mounting members and the optical semiconductor elements clamped using the jig, thereby to bond together the mounting member and the optical semiconductor element in each of the multiple sets, by diffusion bonding between the first bonding member or bonding layer and the second bonding member or bonding layer; and
   a step of forming an insulating film on all side surfaces of each of the optical semiconductor elements in which the light emitting part is provided;
   wherein said step of heating and said step of forming are performed concurrently.

4. The method for manufacturing an optical semiconductor device according to claim 3, wherein the first bonding member or bonding layer, and the second bonding member or bonding layer are made of Au.

* * * * *